(12) United States Patent
Moon et al.

(10) Patent No.: US 9,397,319 B2
(45) Date of Patent: Jul. 19, 2016

(54) DISPLAY DEVICE AND METHOD OF MANUFACTURING THE SAME

(71) Applicant: Samsung Display Co., Ltd., Yongin, Gyeonggi-Do (KR)

(72) Inventors: Sung-Jae Moon, Yongin (KR); Kyong-Tae Park, Yongin (KR); Deok-Young Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 116 days.

(21) Appl. No.: 14/017,151

(22) Filed: Sep. 3, 2013

(65) Prior Publication Data

US 2014/0292185 A1  Oct. 2, 2014

(30) Foreign Application Priority Data

Mar. 27, 2013  (KR) .......................... 10-2013-0033088

(51) Int. Cl.
  *H01J 1/62*  (2006.01)
  *H01J 63/04*  (2006.01)
  *H01L 51/56*  (2006.01)
  *H01L 51/00*  (2006.01)
  *H01L 51/52*  (2006.01)

(52) U.S. Cl.
  CPC ............ *H01L 51/56* (2013.01); *H01L 51/0031* (2013.01); *H01L 51/5246* (2013.01); *Y10T 156/10* (2015.01)

(58) Field of Classification Search
  CPC . H01L 51/0031; H01L 51/56; H01L 51/5246; Y10T 156/10

USPC .......... 313/504, 512; 156/154, 60; 445/24, 25
See application file for complete search history.

(56) References Cited

U.S. PATENT DOCUMENTS

| | | | |
|---|---|---|---|
| 2006/0202615 A1* | 9/2006 | Murakami et al. | 313/506 |
| 2007/0170861 A1 | 7/2007 | Lee et al. | |
| 2008/0111492 A1* | 5/2008 | Kwak et al. | 315/169.3 |
| 2008/0160864 A1* | 7/2008 | Song | H01L 51/5237 445/3 |
| 2009/0315459 A1* | 12/2009 | Kwon | H01L 27/3276 313/505 |
| 2010/0195039 A1* | 8/2010 | Park | B23K 26/08 349/152 |
| 2012/0161805 A1* | 6/2012 | Jung | G09G 3/006 324/754.07 |
| 2013/0340934 A1* | 12/2013 | Chen | B32B 37/12 156/275.5 |

FOREIGN PATENT DOCUMENTS

| | | |
|---|---|---|
| KR | 10-2005-0048133 A | 5/2005 |
| KR | 10-2006-0077466 A | 7/2006 |
| KR | 10-2007-0077010 A | 7/2007 |
| KR | 10-2009-0097003 A | 9/2009 |

* cited by examiner

*Primary Examiner* — Anh Mai
*Assistant Examiner* — Glenn Zimmerman
(74) *Attorney, Agent, or Firm* — Lewis Roca Rothgerber Christie LLP

(57) ABSTRACT

A display device and a method of manufacturing the display device. The display device includes: a first substrate including a display region at which pixels are located; a second substrate on the first substrate while covering the display region; a sealant between the first substrate and the second substrate and surrounding the display region; and at least one protruding pattern located at an outer side of the sealant with respect to a center of the first substrate or the second substrate, on at least one of the first substrate or the second substrate.

11 Claims, 6 Drawing Sheets

DISPLAY DEVICE AND METHOD OF MANUFACTURING THE SAME

CROSS-REFERENCE TO RELATED APPLICATION

This application claims priority to and the benefit of Korean Patent Application No. 10-2013-0033088, filed on Mar. 27, 2013, in the Korean Intellectual Property Office, the disclosure of which is incorporated herein in its entirety by reference.

BACKGROUND

1. Field

Embodiments of the present invention relate to a display device and a method of manufacturing the same.

2. Description of the Related Art

Recently, thin film type or flat panel type display devices that are organic light emitting display devices and liquid crystal display (LCD) devices have been widely used in everything from small mobile electronic devices to large type display home appliances such as televisions. Such a display device includes a stack structure of a first substrate and a second substrate and a structure for display formed on at least one of the first and second substrates.

After the first substrate and the second substrate of the display device are bonded to face each other, a lighting inspection and a module inspection are performed to check whether or not the display device properly operates. Before the lighting inspection and the module inspection are performed, an inspection pad is exposed by cutting edges of the first substrate and the second substrate. After the first substrate and the second substrate are cut, a grinding process of grinding rough cutting sides of the first substrate and the second substrate may be performed.

By performing the grinding process, edges of the cutting sides of the first substrate and the second substrate are polished, and internal durability of the first substrate and the second substrate against damage is enhanced. Water may also be used during the grinding process and may be filled between the first substrate and the second substrate due to a capillary action phenomenon. The water may make it difficult to separate the pieces of the first substrate and the second substrate when the first substrate and the second substrate are additionally cut because of adhesive forces or may induce corrosion of elements located on the first substrate and the second substrate, which causes deterioration of reliability of the display device. Furthermore, water is not easily removed once it is filled between the first substrate and the second substrate.

SUMMARY

Embodiments of the present invention provide a display device and a method of manufacturing the same.

Additional aspects will be set forth in part in the description which follows and, in part, will be apparent from the description, or may be learned by practice of the presented embodiments.

According to an aspect of embodiments according to the present invention, there is provided a display device including: a first substrate including a display region at which pixels are located; a second substrate on the first substrate and covering the display region; a sealant between the first substrate and the second substrate and surrounding the display region; and at least one protruding pattern located at an outer side of the sealant with respect to a center of the first substrate or the second substrate, on at least one of the first substrate or the second substrate.

The first substrate and the second substrate may include cutting surfaces.

The cutting surfaces may be located at an outer side of the sealant with respect to a center of the display device.

The at least one protruding pattern may be located at a region that is further from the display device than at least one of the cutting surfaces and a region between at least one of the cutting surfaces and the sealant.

At least two of the protruding pattern may be aligned in at least one of a lengthwise direction of the cutting surfaces or a direction crossing the lengthwise direction of the cutting surfaces.

The at least one protruding pattern may continuously extend in a lengthwise direction of the cutting surfaces.

The cutting surfaces may correspond to each other.

The cutting surfaces may be cut by a short pulse laser beam (SLB) or a diamond wheel.

The at least one protruding pattern may be formed by patterning an organic thin film.

A height of the at least one protruding pattern may be lower than an interval between the first substrate and the second substrate.

The display device may be an organic light emitting display device or a liquid crystal display (LCD) device.

According to another aspect of embodiments according to the present invention, there is provided a method of manufacturing a display device, the method including: forming a display region including pixels on a first substrate and forming a sealant surrounding the display region on one of the first substrate or a second substrate; forming at least one protruding pattern at an outer side of the sealant with respect to a center of the first substrate or the second substrate, on at least one of the first substrate or the second substrate; and bonding the first substrate and the second substrate with the sealant interposed therebetween.

The method may further include: cutting the first substrate and the second substrate along first cutting surfaces; grinding cutting surfaces of the first substrate and the second substrate that are cut along the first cutting surfaces; and cutting the first substrate and the second substrate along second cutting surfaces, wherein the at least one protruding pattern is formed at a region between the first cutting surfaces and the sealant.

The second cutting surfaces may be located at an outer side of the sealant with respect to a center of the display device, wherein the first cutting surfaces are located farther than the second cutting surfaces from the center of the display device.

The at least one protruding pattern may be formed at a region between the first cutting surfaces and the second cutting surfaces and a region between the second cutting surfaces and the sealant.

The forming of the at least one protruding pattern may include: forming at least two patterns, wherein the at least two patterns are aligned in at least one of a lengthwise direction of the second cutting surfaces or a direction crossing the lengthwise direction of the second cutting surfaces.

The pattern may continuously extend in a lengthwise direction of the second cutting surfaces.

Each of the first cutting surfaces and the second cutting surfaces may be substantially symmetrical to each other on the first substrate and the second substrate, respectively.

The cutting of the first substrate and the second substrate along the first cutting surfaces and the cutting of the first substrate and the second substrate along the second cutting surfaces may include: cutting the first substrate and the second substrate by a short pulse laser beam (SLB) or a diamond wheel.

The cutting of the first substrate and the second substrate along the first cutting surfaces may include: injecting a hydrophobic material in an outer side between the first substrate and the second substrate that are cut along the first cutting surfaces.

The forming of the at least one protruding pattern may include: forming the at least one protruding pattern by patterning an organic thin film.

A height of the at least one protruding pattern may be lower than an interval between the first substrate and the second substrate.

The display device may be an organic light emitting display device or a liquid crystal display (LCD) device.

BRIEF DESCRIPTION OF THE DRAWINGS

The above and other features and aspects of the present invention will become more apparent by describing in detail example embodiments thereof with reference to the attached drawings in which.

DETAILED DESCRIPTION

Figure 1:
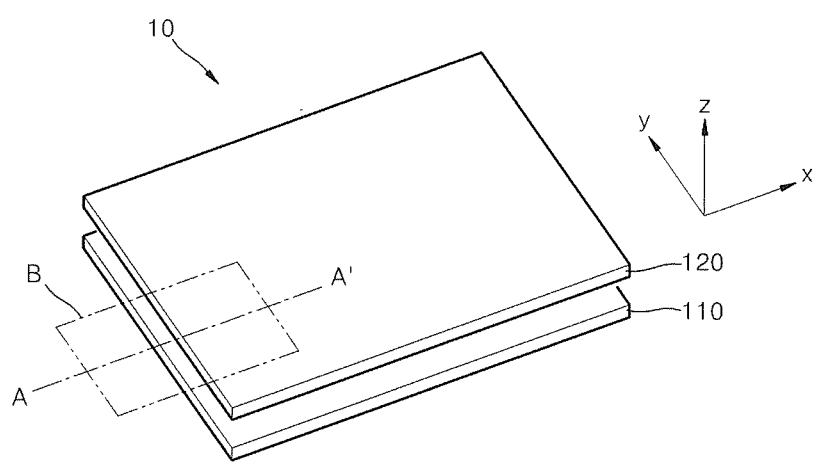
FIG. 1 is a schematic perspective view of a configuration of a display device, according to an embodiment of the present invention.

As the present invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the following description of the present invention, a detailed description of disclosed technologies may not be provided if they may make features of the invention obscure.

While such terms as "first," "second," etc., may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression in the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

The present invention will now be described more fully with reference to the accompanying drawings in which example embodiments of the invention are shown. As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic perspective view of a configuration of a display device 10, according to an embodiment of the present invention. Referring to FIG. 1, the display device 10 includes a first substrate 110, a second substrate 120, and a sealant (for example, the sealant 112 of FIG. 2).

The first substrate 110 may include a display region in which pixels are formed. The second substrate 120 may be located on or over the first substrate 110 while covering the display region. The sealant may be located between the first substrate 110 and the second substrate 120 to bond the first substrate 110 and the second substrate 120 to each other.

The display device 10 may be an organic light emitting display device or a liquid crystal display (LCD) device but is not limited thereto and may be any suitable type of a display device for displaying an image.

FIGS. 2, 3A, 3B, 3C, 4, 5, and 6 are schematic cross-sectional views for explaining a method of manufacturing the display device 10, according to an embodiment of the present invention. FIGS. 2, 3A, 3B, 3C, 4, 5, and 6 are cross-sectional views taken along the line A-A' of FIG. 1.

Figure 2:
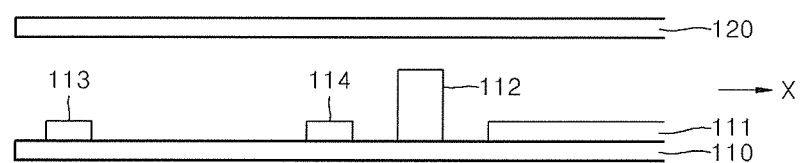
FIGS. 2, 3A, 3B, 3C, 4, 5 and 6 are schematic cross-sectional views for explaining a method of manufacturing a display device, according to an embodiment of the present invention.

The first substrate 110 and the second substrate 120 are prepared as shown in FIG. 2. The first substrate 110 and the second substrate 120 may be formed of a transparent glass material including $SiO_2$ as a main component. However, the first substrate 110 and the second substrate 120 may be formed of an opaque material, and substrates formed of various materials such as a plastic material, a metal material, and the like may be used as the first substrate 110 and the second substrate 120.

An auxiliary layer (not shown) such as a barrier layer, a blocking layer, and/or a buffer layer may be formed on the first substrate 110 and/or the second substrate 120 to prevent impurity ions from being diffused, to prevent permeation of moisture or external air, and/or to planarize surfaces of the first substrate 110 and the second substrate 120. The auxiliary layer (not shown) may be formed through one of various deposition methods, such as a plasma enhanced chemical vapor deposition (PECVD) method, an atmospheric pressure CVD (APCVD) method, a low pressure CVD (LPCVD) method, and the like, by using SiO2 and/or SiNx.

Next, a display region 111 including pixels may be formed on the first substrate 110, and a sealant 112 surrounding the display region 111 may be formed on one of the first substrate 110 and the second substrate 120.

The display region 111 includes a plurality of display elements and displays an image. The sealant 112 may be formed of glass frit but is not limited thereto. For convenience of description, although an example of forming the sealant 112 on the first substrate 110 is shown in FIG. 2, the present invention is not limited thereto and the sealant 120 may be formed on the second substrate 120.

A first inspection pad 113 and a second inspection pad 114 for inspecting the display device 10 may be formed on the first substrate 110. The first inspection pad 113 and the second inspection pad 114 may be pads for inspecting the display device 10, may be electrically connected to the display region 111 or a driving circuit unit for driving the display region 111, and may be formed concurrently with the formation of the display region 111. For example, the first inspection pad 113 and the second inspection pad 114 may be pads for a lighting inspection and a module inspection.

The first inspection pad 113 and the second inspection pad 114 may include pad electrodes for transferring electrical signals to a scan driver and a data driver of the driving circuit unit, and may include integrated circuit (IC) chips.

Referring to FIG. 2, the first inspection pad 113 and the second inspection pad 114 may be formed at an outer edge of the sealant 112. The first inspection pad 113 may be farther from the outer edge of the sealant 112 than the second inspection pad 114. The first inspection pad 113 may be used to inspect the display device 10 and then the second inspection pad 114 may be used to inspect the display device 10.

Figure 3A:
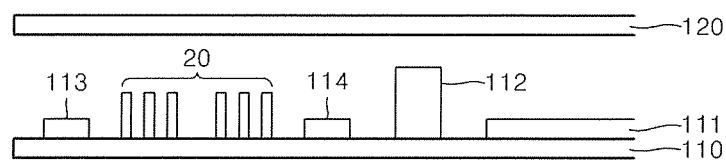
Figure 3B:
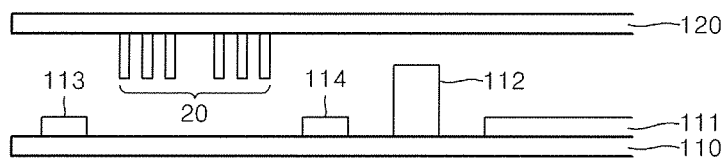
Figure 3C:
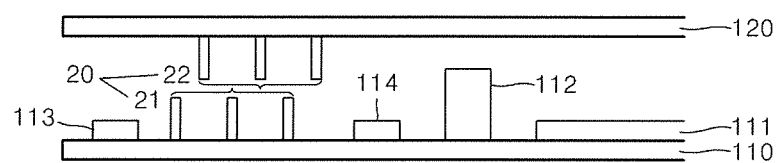

Next, as shown in FIGS. 3A through 3C, at least one protruding pattern 20 is formed at an outer side of the sealant 112 with respect to a center of the first substrate 110 or the second substrate 120 on at least one of the first substrate 110 or the second substrate 120. Referring to FIG. 3A, the at least one protruding pattern 20 may be formed in a region between the first inspection pad 113 and the second inspection pad 114. A height of the protruding pattern 20 may be lower than an interval between the first substrate 110 and the second substrate 120. Accordingly, when the first substrate 110 is bonded to the second substrate 120 with the sealant 112 interposed therebetween during a process that will be described later, the pattern 20 formed on the first substrate 110 may not contact the second substrate 120, and the pattern 20 formed on the second substrate 120 may not contact the first substrate 110.

The pattern 20 may be formed by patterning an organic thin film. The organic thin film may include at least one of polyimide or an acrylic based material (for example, DL-1000CR). Patterning may be performed using a mask processing method such as dry etching or wet etching but is not limited thereto. The pattern 20 may be formed using an inkjet method or an imprinting method. The pattern 20 may be formed on the same layer concurrently with the formation of the display region 111 but is not limited thereto and may be formed separately from the formation of the display region 111.

FIG. 3A shows an example of forming the pattern 20 on the first substrate 110. FIG. 3B shows an example of forming the pattern 20 on the second substrate 120. FIG. 3C shows an example of forming a pattern 21 on the first substrate 110 and a pattern 22 on the second substrate 120.

Although FIGS. 3A through 3C show a total number of six protruding patterns 20, this is merely an example, and the number of the patterns 20 may be one or any number greater than one. Also, shapes of the patterns 20 may be any shapes protruding from the first substrate 110 or the second substrate 120. Diverse embodiments of the shapes of the patterns 20 will be described with reference to FIGS. 7A through 8C.

The above-described sequence of forming the display region 111, the sealant 112, the first inspection pad 113, the second inspection pad 114, and the patterns 20 is not limited thereto. For example, the patterns 20 may be firstly formed before elements are formed on the first substrate 110 or the second substrate 120, and may be formed concurrently with the formation of one of the display region 111, the sealant 112, the first inspection pad 113, and the second inspection pad 114.

For convenience of description, a subsequent process will now be described with reference to FIG. 3A. However, the same subsequent process may be applied to FIGS. 3B and 3C.

Figure 4:
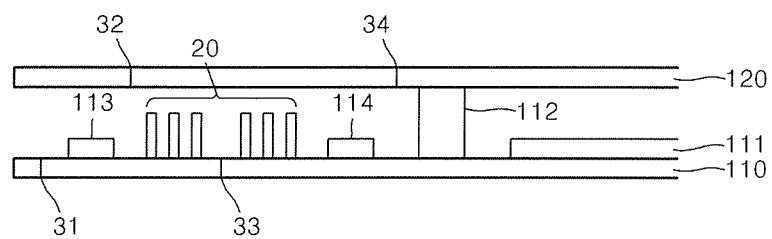

Next, as shown in FIG. 4, the first substrate 110 and the second substrate 120 are bonded to each other with the sealant 112 interposed therebetween. For example, when the first substrate 110 and the second substrate 120 are bonded to each other and the sealant 112 is melted by using laser, the sealant 112 is hardened so that the first substrate 110 and the second substrate 120 may be bonded to each other.

Referring to FIG. 4, the first substrate 110 includes a first cutting surface 31 firstly cut and a second cutting surface 33 secondly cut. According to a subsequent process that will be described later, the first substrate 110 may be cut along the first cutting surface 31 and the second cutting surface 33. The second substrate 120 may include a first cutting surface 32 firstly cut and a second cutting surface 34 secondly cut. The first cutting surface 32 and the second cutting surface 34 may be cut according to a subsequent process that will be described later.

The first cutting surfaces 31 and 32 and the second cutting surfaces 33 and 34 may be located at an outer side of the sealant 112 with respect to a center of the display device 10. For example, the second cutting surfaces 33 and 34 may be located at the outer side of the sealant 112 with respect to the center of the display device 10, and the first cutting surfaces 31 and 32 may be farther from the outer side of the sealant 112 than the second cutting surfaces 33 and 34 with respect to the center of the display device 10.

The first cutting surfaces 31 and 32 and the second cutting surfaces 33 and 34 may be symmetrical or substantially symmetrical to each other on the first substrate 110 and the second substrate 120, respectively. For example, the first cutting surfaces 31 and 32 may be symmetrical or substantially symmetrical to the second cutting surfaces 33 and 34, and the first cutting surfaces 31 and 32 may be symmetrical or substantially symmetrical to each other, and the second cutting surfaces 33 and 34 may be symmetrical or substantially symmetrical to each other. The first cutting surface 31 of the first substrate 110 may be located farther to an outer side than the first cutting surface 32 of the second substrate 120, and the second cutting surface 33 of the first substrate 110 may be located farther to the outer side than the second cutting surface 34 of the second substrate 120.

At least one of the first substrate 110 or the second substrate 120 may include the at least one pattern 20 formed on a region between the first cutting surfaces 31 and 32 and the sealant 112. FIG. 4 shows an example of the at least one pattern 20 formed on a region between the first cutting surface 31 of the first substrate 110 and the sealant 112.

As shown in FIG. 4, the at least one pattern 20 on the first substrate 110 may be formed at a region between the first cutting surface 31 and the second cutting surface 33 and at a region between the second cutting surface 33 and the sealant 112. Although not shown in FIG. 4, a pattern (not shown) on the second surface 120 may be formed at a region between the first cutting surface 32 and the second cutting surface 34 and at a region between the second cutting surface 34 and the sealant 112.

Figure 5:
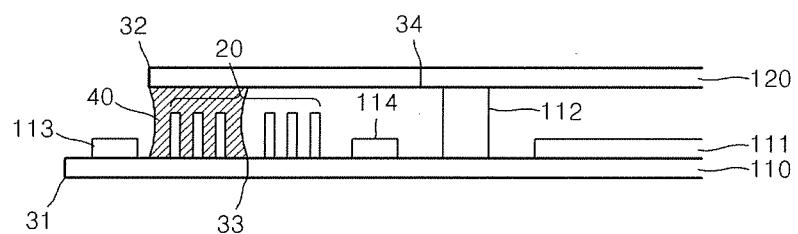

Next, as shown in FIG. 5, the first substrate 110 and the second substrate 120 are cut along the first cutting surfaces 31 and 32 (hereinafter referred to as first cutting). Cutting may be performed by using a cutting tool such as a diamond wheel or a short pulse laser beam (SLB) but is not limited thereto. A stage, the cutting tool or a laser beam generator, a transfer unit, and a cleaning unit may be further used for cutting.

The first inspection pad 113 may be exposed by the first cutting. After the first cutting, a grinding process may be performed on cutting surfaces of the first substrate 110 and the second substrate 120 that are cut along the first cutting surfaces 31 and 32. Water may be used during the grinding process, and the water may be deionized (DI) water or ultrapure DI water.

When the first substrate 110 and the second substrate 120 are cut along the first cutting surfaces 31 and 32, surfaces of the first cutting surfaces 31 and 32 of the first substrate 110 and the second substrate 120 may become very sharp. This may cause cracks in the first substrate 110 and the second substrate 120 even due to a small shock, and generate unnecessary glass pieces, which may induce a short circuit of the first inspection pad 113 or an undesired malfunction of the display device. Therefore, the grinding process may be performed to polish rough surfaces of the first cutting surfaces 31 and 32. The grinding process may use a whetstone and water.

The water used in the grinding process may be filled between the first substrate 110 and the second substrate 120 due to a capillary action phenomenon. In this regard, an adhesive force of the water spreads due to the patterns 20, and foam is generated due to steps formed by the patterns 20, and thus an amount of water filled between the first substrate 110 and the second substrate 120 may be reduced (e.g., dramatically reduced).

The capillary action phenomenon occurs due to gravity between atoms, molecules, or ions of a material. Distances between water molecules are increased due to the patterns 20 so that gravity between the water molecules is reduced, and an amount of injected water caused by the capillary action phenomenon is reduced.

According to another embodiment of the present invention, before the grinding process is performed, a small amount of a hydrophobic material 40 may be inserted into an outer side between the first substrate 110 and the second substrate 120 that are cut along the first cutting surfaces 31 and 32. The hydrophobic material 40 is a material that is not easily combined with water molecules and may be a material that does not include a functional group having affinity to water molecules. For example, the hydrophobic material 40 may be an oil class material or a benzene based material.

Referring to FIG. 5, the hydrophobic material 40 may be inserted so as to fill a part of the patterns 20 but is not limited thereto. However, the hydrophobic material 40 may be filled only at the outer side (or outside) of the second cutting surface 33 and may be removed when the second cutting surface 33 is cut. The inserted hydrophobic material 40 may prevent the water from penetrating between the first substrate 110 and the second substrate 120 during the grinding process. However, the insertion of the hydrophobic material 40 may be skipped.

After the first cutting and the grinding process, the first inspection pad 113 may be used to inspect the display device 10. For example, the first inspection pad 113 may be used to perform the lighting inspection on the display region 111 so as to inspect whether or not the display device 10 properly operates. During the lighting inspection, a malfunction of the display device 10 may be inspected with respect to a display status of the display region 111.

Figure 6:
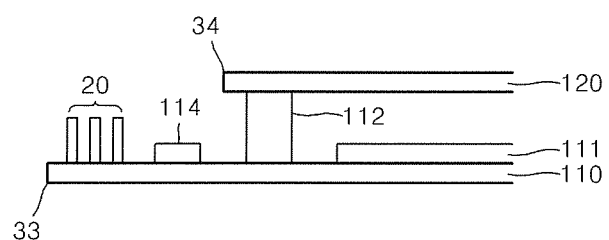

Next, as shown in FIG. 6, the first substrate 110 and the second substrate 120 are cut along the second cutting surfaces 33 and 34 (hereinafter referred to as second cutting). Cutting may be performed by using a cutting tool such as a diamond wheel or a short pulse laser beam (SLB) but is not limited thereto.

The second inspection pad 114 may be exposed by the second cutting. After the second cutting, the grinding process may be performed on cutting surfaces of the first substrate 110 and the second substrate 120 that are cut along the second cutting surfaces 33 and 34. Water may also be used during the grinding process. Accordingly, rough surfaces of the first substrate 110 and the second substrate 120 that are cut along the second cutting surfaces 33 and 34 may be polished.

After the second cutting or after the second cutting and the grinding process, the second inspection pad 114 may be used to inspect the display device 10. For example, the second inspection pad 114 may be used to perform the module inspection on the display region 111 so as to inspect whether or not the display device 10 properly operates. During the module inspection, an operating status and durability of a module included in the display device 10 may be inspected.

Figure 7A:
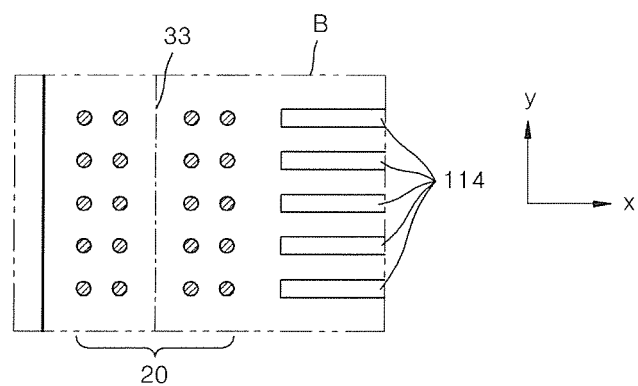
FIGS. 7A, 7B and 7C are views of examples of patterns, according to an embodiment of the present invention.
Figure 7B:
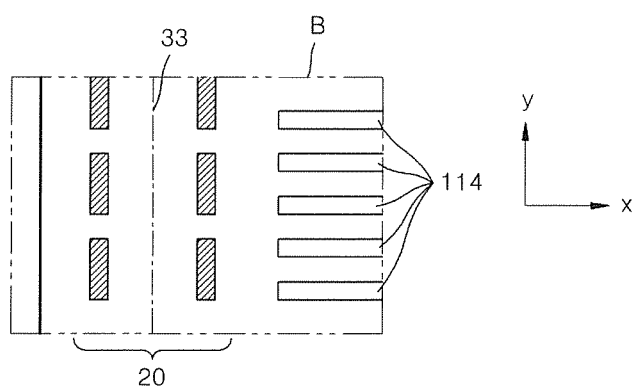
Figure 7C:
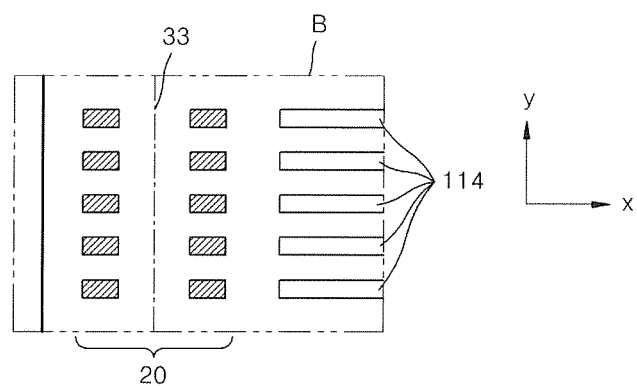

FIGS. 7A through 7C are views of examples of patterns, according to an embodiment of the present invention. FIGS. 7A through 7C are front views of the first substrate 110 of a region B of FIG. 1 in a z-axis direction when the patterns 20 are formed on the first substrate 110. Also, for convenience of description, FIGS. 7A through 7C show the first substrate 110 that is firstly cut along the first cutting surface 31.

Referring to FIGS. 7A through 7C, at least two of the patterns 20 may be formed and may be aligned in at least one of a lengthwise direction of the second cutting surface 33 or a direction crossing the lengthwise direction of the second cutting surface 33.

Referring to FIGS. 7A through 7C, the patterns 20 may be aligned in a y axis direction that is the lengthwise direction of the second cutting surface 33 and may be aligned in an x axis direction that is the direction crossing the lengthwise direction of the second cutting surface 33. FIGS. 7A through 7C each illustrate shapes of the patterns 20, but the shapes of the patterns 20 are not limited thereto.

Figure 8A:
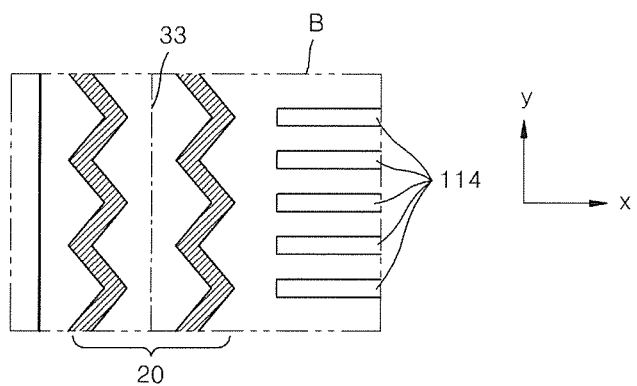
FIGS. 8A, 8B and 8C are views of examples of patterns, according to another embodiment of the present invention.
Figure 8B:
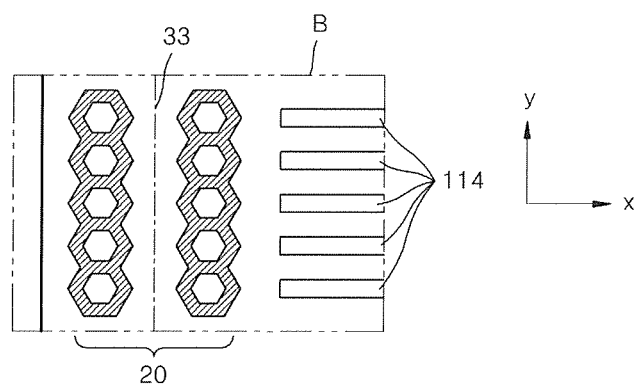
Figure 8C:
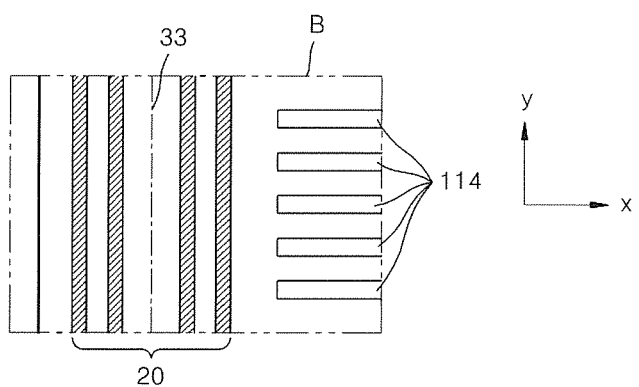

FIGS. 8A through 8C are views of diverse examples of patterns, according to another embodiment of the present invention. FIGS. 8A through 8C are front views of the first substrate 110 of a region B of FIG. 1 in a z-axis direction when the patterns 20 are formed on the first substrate 110. Also, for convenience of description, FIGS. 8A through 8C show the first substrate 110 that is firstly cut along the first cutting surface 31.

Referring to FIGS. 8A through 8C, the patterns 20 may be continuously formed in a lengthwise direction of the second cutting surface 33. Referring to FIGS. 8A through 8C, the patterns 20 may be continuously formed in a y axis direction that is the lengthwise direction of the second cutting surface 33. If the patterns 20 are formed as described above, a possibility of separating the patterns 20 from the first substrate 110 may be reduced compared to a case wherein small patterns are separately formed.

Although examples of a case where the patterns 20 are formed on the first substrate 110 are shown in FIGS. 7 and 8, the above-described examples of the patterns 20 may be applied to a case where the patterns 20 are formed on the second substrate 120.

According to the above-described embodiments, a phenomenon in which water used in a grinding process is filled between the first substrate 110 and the second substrate 120 after the first cutting of the first substrate 110 and the second substrate 120 occurs. An adhesive force of the water spreads due to the patterns 20 formed on at least one of the first substrate 110 or the second substrate 120, and thus an amount of the water filled between the first substrate 110 and the second substrate 120 may be reduced (e.g., dramatically reduced).

Also, after the first cutting of the first substrate 110 and the second substrate 120, a blocking film for blocking the water may be formed by injecting a small amount of the hydrophobic material 40 between the first substrate 110 and the second substrate 120 before the grinding process, and thus the water used in the grinding process may not be filled between the first substrate 110 and the second substrate 120.

Accordingly, during the second cutting of the first substrate 110 and the second substrate 120 after the grinding process, pieces of the cut first substrate 110 and the second substrate 120 may be easily separated, elements between the first substrate 110 and the second substrate 120 may be prevented from being corroded due to the water absorbed therebetween, and reliability of the display device 10 may be enhanced or improved.

According to the example embodiments of the present invention as described above, absorption of water into two substrates may be reduced during a grinding process by forming a protruding pattern between the two substrates. Accordingly, additional processing of the two substrates may be facilitated or reliability of a display device may be enhanced.

While the present invention has been particularly shown and described with reference to example embodiments thereof, it will be understood by those of ordinary skill in the art that various changes in form and details may be made therein without departing from the spirit and scope of the present invention as defined by the following claims and their equivalents.

What is claimed is:

1. A display device comprising:
   a first substrate comprising a display region at which pixels are located;
   a second substrate on the first substrate and covering the display region;
   a sealant between the first substrate and the second substrate and surrounding the display region;
   at least one protruding pattern located at an outer side of the sealant with respect to a center of the first substrate or the second substrate, on at least one of the first substrate or the second substrate; and
   an inspection pad configured to inspect the display device, the inspection pad being positioned between the at least one protruding pattern and the sealant and spaced from the sealant and the at least one protruding pattern.

2. The display device of claim 1, wherein the first substrate and the second substrate comprise cutting surfaces.

3. The display device of claim 1, wherein the at least one protruding pattern comprises an organic material.

4. The display device of claim 1, wherein a height of the at least one protruding pattern is lower than an interval between the first substrate and the second substrate.

5. The display device of claim 1, wherein the display device is an organic light emitting display device or a liquid crystal display (LCD) device.

6. The display device of claim 2, wherein the cutting surfaces are located at an outer side of the sealant with respect to a center of the display device.

7. The display device of claim 2, wherein the at least one protruding pattern is located at a region that is further from the display device than at least one of the cutting surfaces and a region between at least one of the cutting surfaces and the sealant.

8. The display device of claim 2, wherein the at least one protruding pattern comprises at least two protruding patterns that are aligned in at least one of a lengthwise direction of the cutting surfaces or a direction crossing the lengthwise direction of the cutting surfaces.

9. The display device of claim 2, wherein the at least one protruding pattern continuously extends in a lengthwise direction of the cutting surfaces.

10. The display device of claim 2, wherein the cutting surfaces correspond to each other.

11. The display device of claim 2, wherein the cutting surfaces are cut by a short pulse laser beam (SLB) or a diamond wheel.

\* \* \* \* \*